US006836489B2

United States Patent
Nishimura et al.

(10) Patent No.: US 6,836,489 B2
(45) Date of Patent: Dec. 28, 2004

(54) METHOD OF AND APPARATUS FOR CONTROLLING WAVELENGTH VARIABLE SEMICONDUCTOR LASER WITHOUT PREPARING A HIGH-PRECISION CURRENT TABLE

(75) Inventors: Tetsuya Nishimura, Tokyo (JP); Mitsunobu Gotoda, Tokyo (JP); Yoshihito Hirano, Tokyo (JP); Masao Imaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 107 days.

(21) Appl. No.: 10/288,546

(22) Filed: Nov. 6, 2002

(65) Prior Publication Data

US 2004/0008743 A1 Jan. 15, 2004

(30) Foreign Application Priority Data

Jul. 10, 2002 (JP) .................................... 2002-201597

(51) Int. Cl.$^7$ .............................. H01S 3/10; H01S 3/13
(52) U.S. Cl. ..................... 372/20; 372/29.015; 372/32; 372/38.02; 372/38.07
(58) Field of Search .................... 372/20, 32, 29.015, 372/38.02, 38.07, 43, 96

(56) References Cited

U.S. PATENT DOCUMENTS

| 4,719,636 | A | * | 1/1988 | Yamaguchi | ................... | 372/50 |
| 5,155,736 | A | * | 10/1992 | Ono et al. | ..................... | 372/20 |
| 5,379,318 | A | * | 1/1995 | Weber | .......................... | 372/96 |
| 5,642,371 | A | * | 6/1997 | Tohyama et al. | ............. | 372/45 |
| 6,104,516 | A | | 8/2000 | Majima | | |
| 6,580,740 | B2 | * | 6/2003 | Funabashi et al. | ............ | 372/50 |

FOREIGN PATENT DOCUMENTS

JP          9-331107        12/1997

OTHER PUBLICATIONS

Biernacki, Paul D., et al., "A High–Speed Mixed Digital–to–Analog Circuit Board for Accurate Control of Wavelength Tunable lasers for Fiber–Optic Communications", Journal of Lightwave Technology, vol. 17, No. 7, Jul. 1999, pp. 1222–1228.

Sarlet, Gert, et al., "Control of Widely Tunable SSG–DBR Laser for Dense Wavelength Division Multiplexing", Journal of Lightwave Technology, vol. 18, No. 8, Aug. 2000, pp. 1128–1138.

Ishii, Hiroyuki, et al., "Mode Stabilization Method for Superstructure–Grating DBR Laser", Journal of Lightwave Technology, vol. 16, No. 3, Mar. 1998, pp. 433–442.

* cited by examiner

*Primary Examiner*—Minsun Oh Harvey
*Assistant Examiner*—James Menefee
(74) *Attorney, Agent, or Firm*—Leydig, Voit & Mayer, Ltd.

(57) ABSTRACT

An oscillation state of a semiconductor laser is decided. Injection current to the first and second light reflectors of the semiconductor laser are simultaneously swept based on the oscillation state of the semiconductor laser to obtain current conditions of the injection current to the first and second light reflectors that carry out single-mode oscillation in a target wavelength. The semiconductor laser is drive controlled with the obtained current conditions.

17 Claims, 11 Drawing Sheets

WAVELENGTH

WAVELENGTH

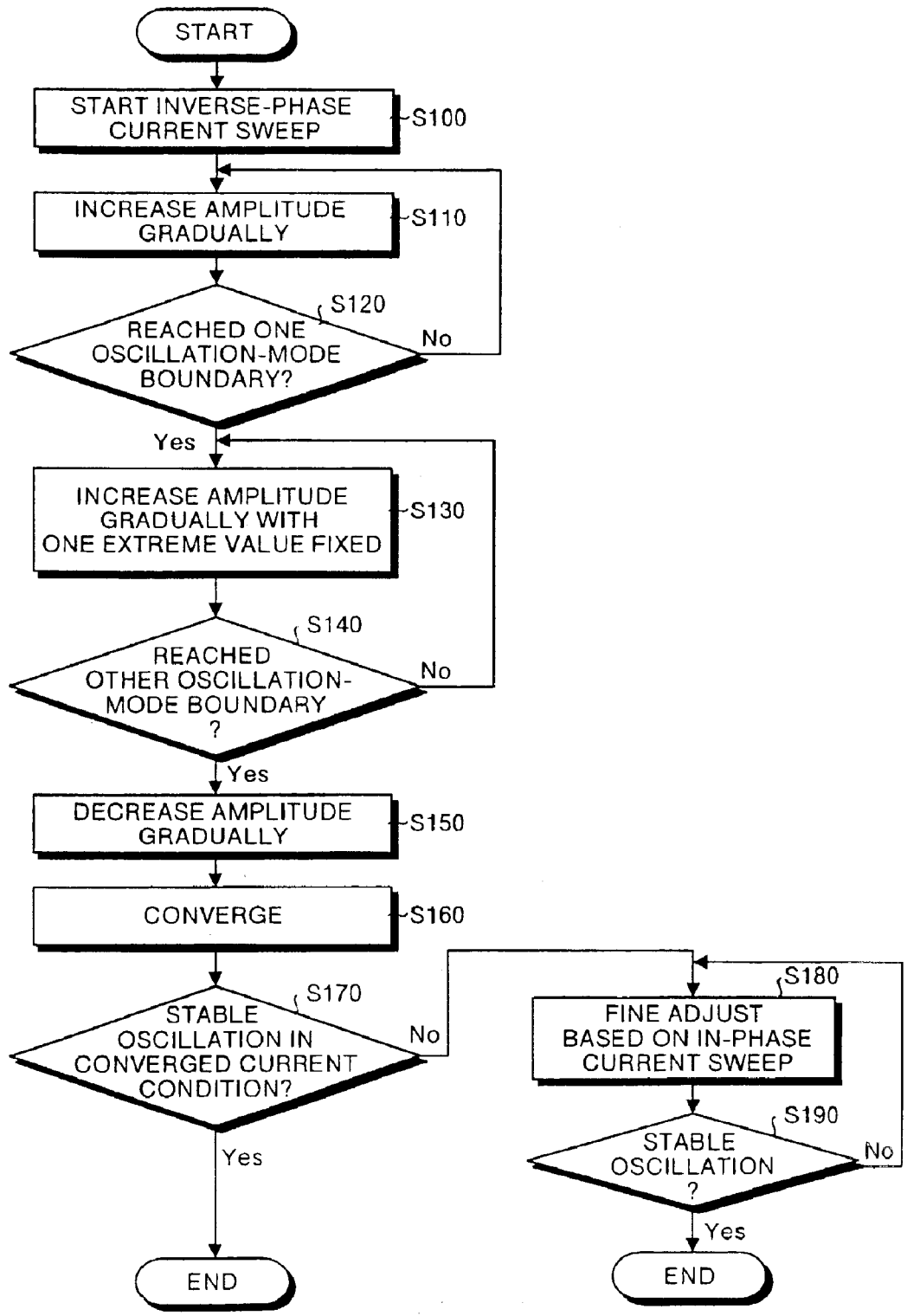

FIG.9
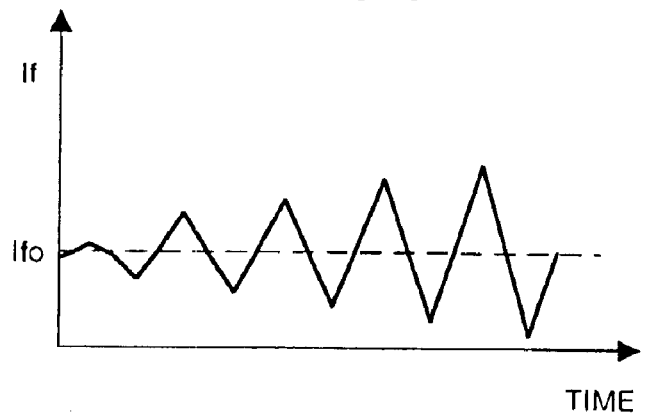
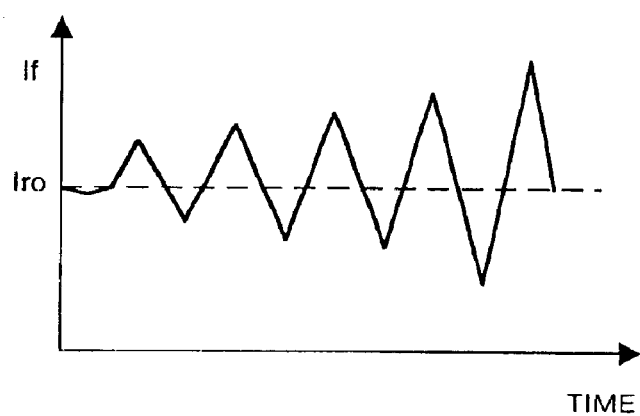
FIG.10
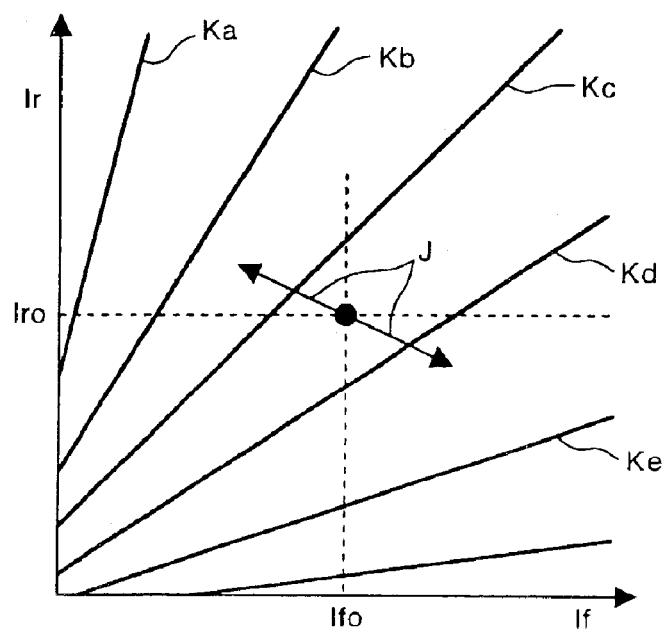

METHOD OF AND APPARATUS FOR CONTROLLING WAVELENGTH VARIABLE SEMICONDUCTOR LASER WITHOUT PREPARING A HIGH-PRECISION CURRENT TABLE

BACKGROUND OF THE INVENTION

1) Field of the Invention

The present invention relates to a method of and an apparatus for controlling the oscillation wavelength of a wavelength variable semiconductor laser. The wavelength variable semiconductor laser is used in wavelength division multiplex transmission (WDM).

2) Description of the Related Art

In an optical communication system that utilizes an optical fiber, a high-density wavelength division multiplexing (DWDM) system has come to be used. This DWDM system is a system that transmits waves by multiplexing a plurality of different wavelengths in one optical fiber. It is necessary to stabilize the light wavelengths with high precision.

A distributed feedback (DFB) laser is generally used as a light source in the DWDM system. This DFB laser forms a diffraction grating that selectively reflects a wave having only one wavelength, in an optical amplification area. Therefore, the use of the DFB laser stabilizes the oscillation-mode and can realize a semiconductor laser producing single wavelength light. Usually, one light source is used for one channel (wavelength) in an optical machine that is used in the WDM system. As the DFB laser has a small wavelength variable area, one DFB laser is necessary for one channel in a preparatory light source for handling trouble. This makes the system expensive.

To make the system cheaper, it is necessary to use a laser having a large wavelength variable area for the light source. A distributed Bragg reflector (DBR) semiconductor laser has diffraction gratings disposed at both sides of an optical amplification area as light reflectors having wavelength dependency. This DBR semiconductor laser selectively reflects a wave having only a specific wavelength, and amplifies the wave in the optical amplification area, thereby generating an oscillation light having one peak wavelength. It is possible to change the oscillation wavelength by about a few dozen nm by changing the injection current to the diffraction gratings at both sides. However, in the semiconductor laser having a DBR structure with relatively small intervals between the reflection peaks, the oscillation-mode becomes unstable. This unstable oscillation-mode occurs due to mode hopping in which a wavelength jumps to an adjacent wavelength when the reflection peaks of the diffraction gratings at both sides coincide with each other, or due to contention between adjacent oscillation longitudinal-modes.

As methods of controlling the wavelength of the wavelength variable semiconductor laser, there is a current control system for controlling the injection current to a light reflector, and a temperature adjusting system for adjusting the temperature of the laser device.

Control methods using a current control table as one of the current control systems are disclosed in "A High-speed mixed Digital-to-Analog circuit board for accurate control of wavelength tunable lasers for fiber-optic" Paul D. Biernacki, et al., Journal of Lightwave Technology. vol. 17, No. 7, July (1999) 1222–1228. Or "Control of widely tunable SSG-DBR Lasers for dense wavelength division multiplexing" Gert. Sarlet, et al. Journal of Lightwave Technology. vol. 18 No. 8 (2000) 1128–1138. Or "Mode stabilization method for Superstructure-Grating DBR Lasers" Hiroyuki. Ishii, et al., Journal of Lightwave Technology, vol. 16 No3(1998) 433–442.

According to the above control methods using a current control table, a two-dimensional data table is prepared that has injection currents I1 and I2 to the light reflectors (diffraction gratings) at both sides as variables. Data relating to the oscillation characteristic is registered for each combination of the injection currents I1 and I2. The wavelength is controlled using the registered data. According to the control method using the current table system, response follow-up of the wavelength control is satisfactory, and it is possible to achieve high-speed control. However, according to this control method using the current table system, control of the laser device with the lapse of time is not satisfactory. Further, it is essential to prepare a current table that prescribes the oscillation wavelength of each laser device for inspection prior to the shipment. This results in an increase in cost.

On the other hand, according to the method based on temperature control, the stability of the control of the prescribed wavelength is excellent. However, a time of milliseconds is necessary to stabilize the temperature, and it is not possible to carry out high-speed control. Further, when the temperature of the laser device has changed, an optimum point of wavelength control changes due to the temperature dependency of the internal quantum efficiency and the gain curve. Consequently, control becomes complex. Further, according to the method based on temperature control, the wavelength range in which the wavelength can be adjusted within a practical temperature range is about only a few nm.

As a conventional technique of a hybrid system that takes into account the advantages of both methods, there is one method as disclosed in Japanese Patent Application Laid-open No. 9-931107. According to this conventional technique, first, the wavelength is shifted based on current control. Then, the wavelength shift based on the current control is replaced with a wavelength shift quantity based on the temperature control. With this arrangement, the wavelength control is carried out taking into account both advantages of the current control in which response is fast but the wavelength variable range is narrow and the temperature control in which the wavelength variable range is wide but response is slow.

According to this conventional technique, both high speed and stability are realized by combining the current control and the temperature control. However, the time lapse of the laser device is managed based on the temperature control. Therefore, the operation condition changes, and the control becomes complex. According to this conventional technique, it is still essential to prepare the current table for inspection prior to the shipment.

The above conventional techniques have problems in that it is expensive to prepare a current table for each device prior to shipment, and that it is difficult to guarantee long-term stability.

According to the conventional technique of the hybrid system, the long-term stability and the current setting method have been improved to some extent. However, as this control method is based on the reflection mode of each mirror, the range of stability is small. In other words, it is not possible to simplify the inspection to correspond to a constant-output operation including mirror loss. It is not possible to manage time lapse exceeding a wavelength mode boundary. Further, as a modulation-synchronized detection is used for a signal detection method, the module installation becomes complex and expensive.

SUMMARY OF THE INVENTION

It is an object of this invention to provide a method and apparatus that can converge an oscillation control point to a stable point corresponding to a target wavelength in a more efficient manner.

The wavelength control apparatus according to one aspect of the present invention controls an oscillation wavelength of a wavelength variable semiconductor laser. The wavelength variable semiconductor laser has first and second light reflectors and an active layer area disposed between the first and second light reflectors. Each of the first and second light reflectors has a plurality of reflection peaks. An oscillation state deciding section decides the oscillation state of the wavelength variable semiconductor laser. A drive controller obtains the current conditions of an injection current to the first light reflector and an injection current to the second light reflector that carry out single-mode oscillation in a target wavelength, by simultaneously sweeping the injection current to the first light reflector and the injection current to the second light reflector based on the oscillation status obtained by the oscillation state deciding section. Moreover, the drive controller drive-controls the wavelength variable semiconductor laser with the obtained current conditions. As a result, there is no need to prepare a high-precision current table.

The wavelength control method according to another aspect of the present invention controls an oscillation wavelength of a wavelength variable semiconductor laser. The wavelength variable semiconductor laser has first and second light reflectors and an active layer area disposed between the first and second light reflectors. Each of the first and second light reflectors has a plurality of reflection peaks. In changing the oscillation wavelength, a same-oscillation-mode area that is encircled by two oscillation-mode boundaries that includes the oscillation point corresponding to the current wavelength to thereby obtain a virtual point corresponding to the target wavelength is extended. Moreover, the oscillation control point corresponding to the changed wavelength beyond the oscillation-mode boundary by using predetermined equations based on the injection currents to the first and second light reflectors and the oscillation-mode boundaries for this virtual point and the oscillation point corresponding to the current wavelength is obtained. As a result, there is no need to prepare a high-precision current table.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 8 is a flowchart that shows how a current sweep control of the wavelength variable semiconductor laser is performed in the first embodiment of the present invention.

FIG. 9 shows a current waveform of an inverse-phase current sweep control.

FIG. 10 shows sweep directions of an oscillation control point at the time of an inverse-phase current sweep control.

DETAILED DESCRIPTIONS

Embodiments of the wavelength control apparatus and wavelength control method for a wavelength variable semiconductor laser relating to the present invention will be explained below with reference to the accompanying drawings.

Figure 1:
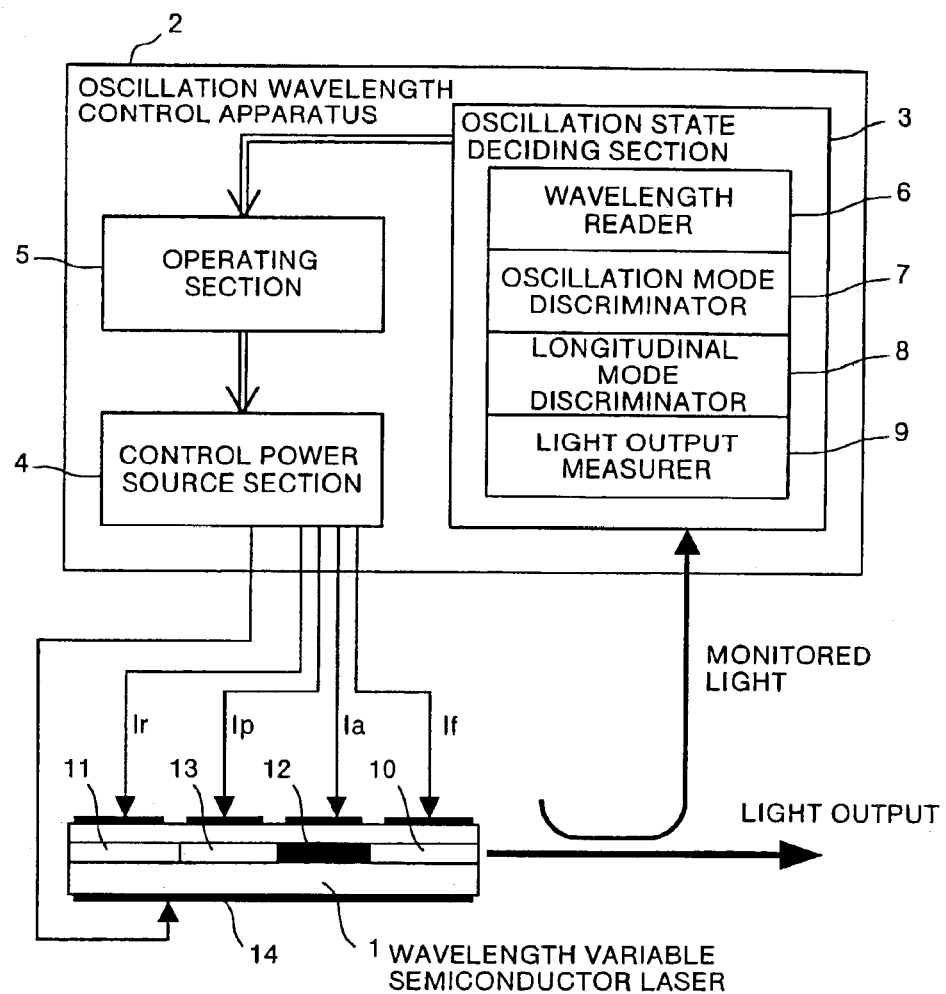
FIG. 1 is a block diagram of a wavelength control apparatus according to a first embodiment of the present invention.

FIG. 1 is a block diagram of a wavelength control apparatus according to a first embodiment of the present invention. This wavelength variable semiconductor laser apparatus comprises a wavelength variable semiconductor laser of the DBR system, and an oscillation wavelength control apparatus 2. This wavelength variable semiconductor laser (a semiconductor laser) 1 is used as a light source to output a laser beam having a prescribed wavelength (each wavelength of an ITU grid) of an optical transmission network.

The semiconductor laser 1 comprises a front reflection mirror area 10, a rear reflection mirror area 11, an active layer area 12 as a gain area, and a phase control area 13 having no gain effect. A temperature adjuster 14 that is made of a heat sink and a Peltier device is disposed adjacent to the chip of the semiconductor laser 1 in order to carry out temperature compensation for maintaining the chip of the semiconductor laser 1 at a constant temperature. An output of a temperature monitor (not shown) that monitors the temperature of the chip of the semiconductor laser 1 is input by feedback to an operating section 5 of a wavelength control apparatus 2. A laser beam that has been emitted from the semiconductor laser 1 is input to an oscillation state deciding section 3 as a monitoring beam via an optical system like an optical coupler and a beam splitter. A laser beam that is emitted backward from the semiconductor laser 1 may also be used as the monitoring beam.

The oscillation wavelength control apparatus 2 is made of the oscillation state deciding section 3 that detects the oscillation state of the semiconductor laser 1, a control power source section 4 that injects a current to the semiconductor laser 1 and controls the temperature of the semiconductor laser 1, and the operating section 5 that calculates control conditions based on the output of the oscillation state deciding section 3 and the output of the temperature monitor, and controls the drive of the control power source section 4.

The oscillation state deciding section 3 comprises a wavelength reader 6 that detects an oscillation wavelength, an oscillation-mode discriminator (SSG mode discriminator) 7 that detects a multi-mode simultaneous oscillation of two or more wavelengths, a longitudinal-mode discriminator 8 that detects a longitudinal-mode simultaneous oscillation of the semiconductor laser 1, and a light output measurer 9 that measures a light output (laser intensity).

The semiconductor laser 1 as the light source will be explained. A super-structure grating DBR laser diode (SSG-DBR-LD) will be used for the semiconductor laser 1.

As shown in FIG. 1, the front reflection mirror area (front SSG DBR area) 10 as one of light reflectors that constitute a resonator has a structure of non-uniform diffraction gratings having varied intervals between lattices laid out at multi-stages in a light axis direction. It is possible to realize a reflection spectrum having a plurality of reflection peaks. The rear reflection mirror area (rear SSG DBR area) 11 as the other light reflector has a structure of diffraction gratings having period intervals different from those of the front reflection mirror area 10 laid out at multi-stages. It is possible to realize a reflection spectrum having a plurality of reflection peaks of which reflection peak period is different from that of the front SSG DBR area 10.

The active layer area 12 as a gain area and the phase control area 13 having no gain effect are disposed between the front reflection mirror area 10 and the rear reflection mirror area 11. It is possible to inject current independently into each of these areas 10 to 13. An injection current to the active layer area 12 will be called Ia (hereinafter to be also referred to as a driving current) An injection current to the phase control area 13 will be called Ip. An injection current to the front reflection mirror area 10 will be called If (hereinafter to be also referred to as a front reflector injection current). An injection current to the rear reflection mirror area 11 will be called Ir (hereinafter to be also referred to as a rear reflector injection current).

The oscillation operation of the semiconductor laser 1 will be explained. When the driving current Ia of at least a predetermined threshold value is injected to the active layer area 12, the light that resonates between the front reflection mirror area 10 and the rear reflection mirror area 11 is amplified in the active layer area 12. Then, an emission light is taken out from the front reflection mirror area 10.

Figure 2:
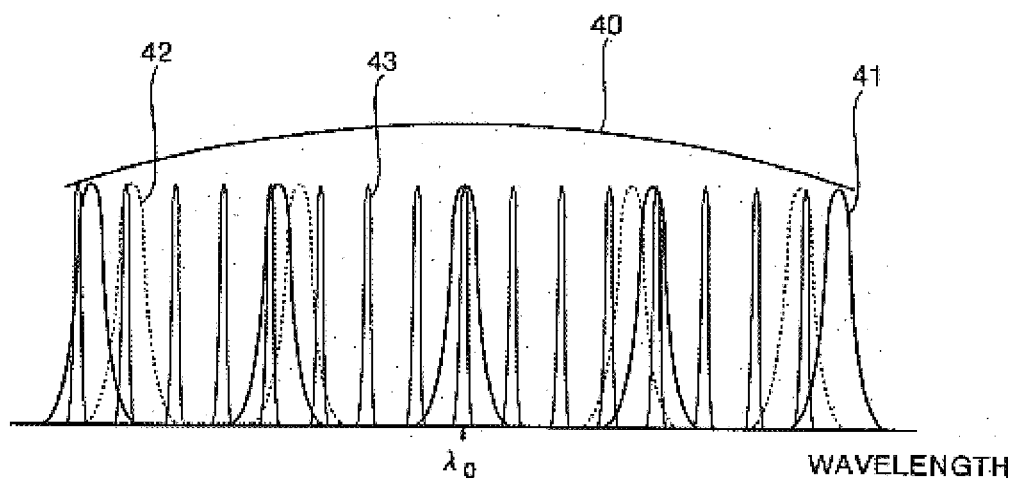
FIG. 2 shows the wavelength characteristic of a gain or a loss in each area of an SSG-DBR semiconductor laser.

The oscillation wavelength is determined based on a gain characteristic and a loss characteristic as shown in FIG. 2. FIG. 2 shows a gain characteristic 40, a reflection characteristic (a thick line) 41 of the front reflection mirror area 10, a reflection characteristic (a dotted line) 42 of the rear reflection mirror area 11, and a resonance longitudinal-mode 43 (a thin line) that is determined based on the length of the resonator between the front reflection mirror area 10 and the rear reflection mirror area 11. The reflection rate becomes maximum when each of the reflection characteristics and the resonance longitudinal-mode reaches the peak. The period (wavelength distance) of the reflection peak 41 of the front reflection mirror area 10 and the period of the reflection peak 42 of the rear reflection mirror area 11 are slightly different from each other as described above.

The wavelength in which the reflection peak of the front reflection mirror area 10 and the reflection peak of the rear reflection mirror area 11 coincide with each other within the gain band 40 is specifically called an SSG mode. The oscillation occurs in the wavelength in which this SSG mode coincides with the resonance longitudinal-mode. In the example shown in FIG. 2, the SSG mode coincides with the resonance longitudinal-mode in a wavelength λ0 near the center. The oscillation occurs near this wavelength λ0.

The gain band and the SSG mode are adjusted by changing the injection current Ia to the active layer area 12, the injection current If to the front reflector, the injection current Ir to the rear reflector, and a device temperature Td of the semiconductor laser 1. The wavelength is adjusted by changing the injection current Ip to the phase control area 13, and changing the resonance longitudinal-mode.

Figure 3:
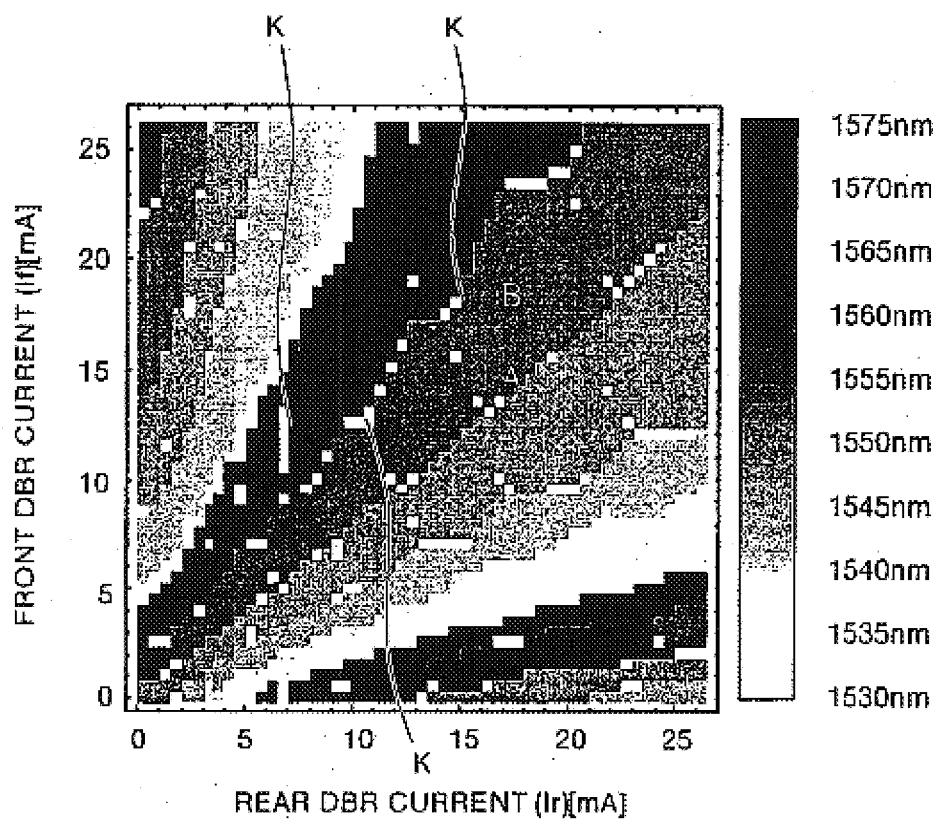
FIG. 3 shows If and Ir characteristics of the SSG-DBR semiconductor laser.
Figure 4:
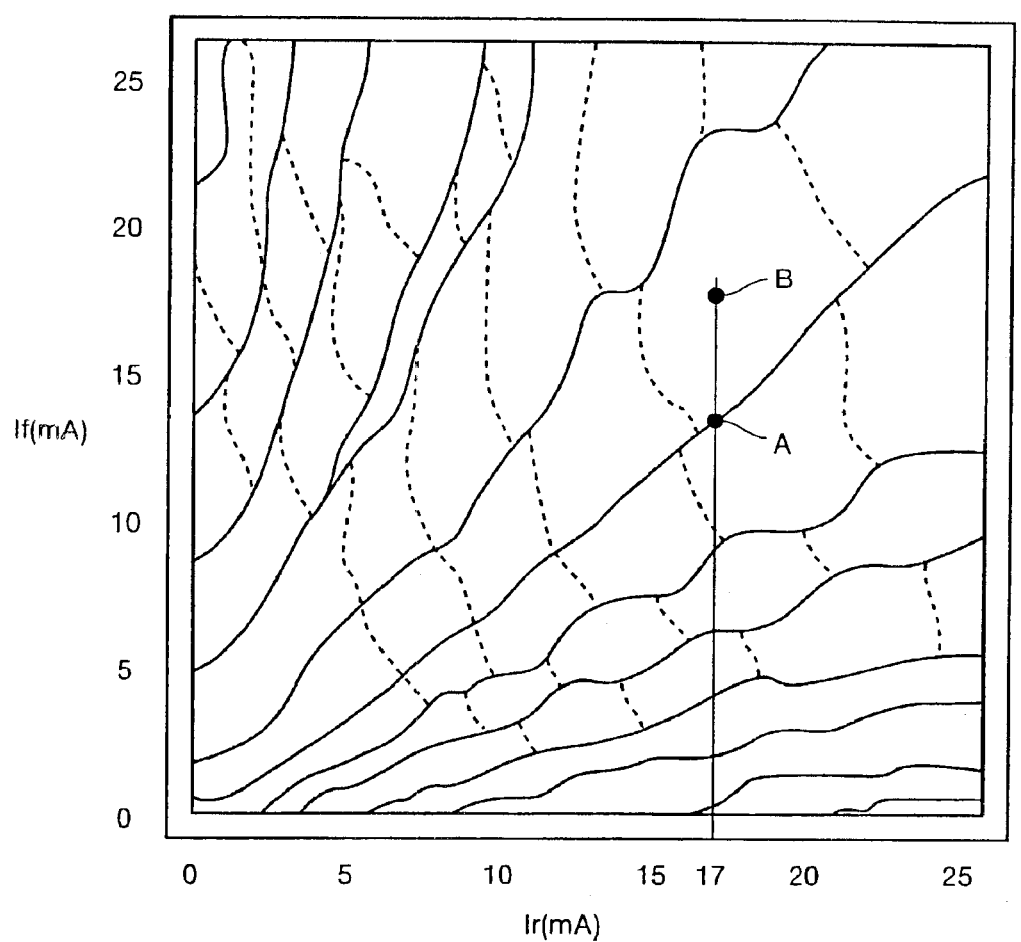
FIG. 4 explains the wavelength boundary areas of the If and Ir characteristics shown in FIG. 3.

FIG. 3 shows the distribution of the oscillation wavelength when the injection current If to the front reflector and the injection current Ir to the rear reflector have been changed under a condition that the injection current Ia to the active layer area 12 is constant. FIG. 4 shows the wavelength boundaries of the wavelength distribution shown in FIG. 3. In FIG. 4, the wavelength boundaries have been shown with solid lines and broken lines to make a visual recognition of the boundaries shown in FIG. 3 simple. The broken lines in FIG. 4 show the wavelength boundaries that extend in the direction from a left upper position to a right lower position which cannot be clearly visualized in FIG. 3.

FIG. 3 shows that the oscillation wavelength becomes longer as the color becomes thicker. While it is difficult to visually recognize in FIG. 3, the oscillation wavelength continuously changes to a short-wavelength side from a left lower position to a right upper position in each of a plurality of areas encircled by the solid lines that extend from a left lower position to a right upper position in FIG. 4. The boundaries of these continuous changes correspond to the broken lines shown in FIG. 4.

Figure 5:
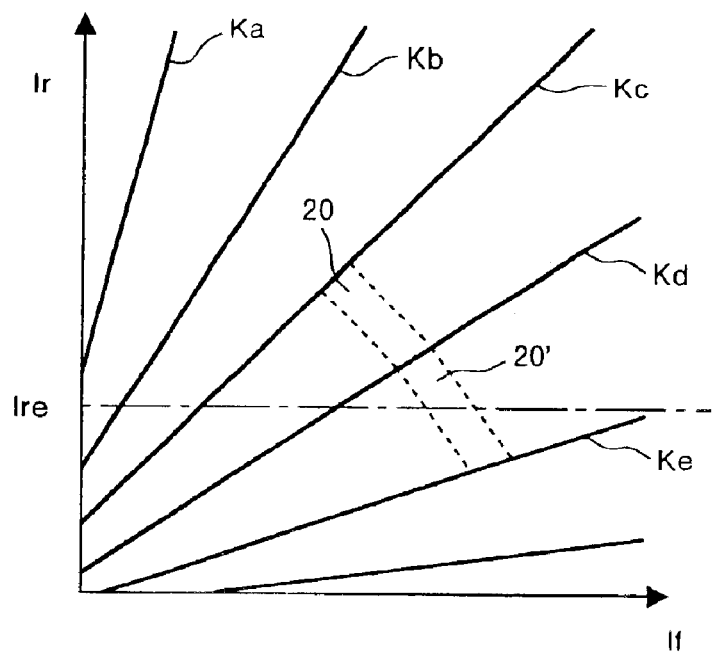
FIG. 5 shows simplified versions of the If and Ir characteristics shown in FIG. 4.

FIG. 5 is a simplified version of FIG. 4. FIG. 5 shows an abstract of a plurality of oscillation-mode boundaries Ka to Ke that are expressed by solid lines each extending from a left lower position to a right upper position, and one same-wavelength oscillation area 20 encircled by solid lines and broken lines. One same-wavelength oscillation area 20 corresponds to one scale-shaped area that is encircled by the solid lines and the broken lines in FIG. 4. In FIG. 5, the horizontal axis shows If, and the vertical axis shows Ir, that are different from those shown in FIG. 3 and FIG. 4.

Figure 6:
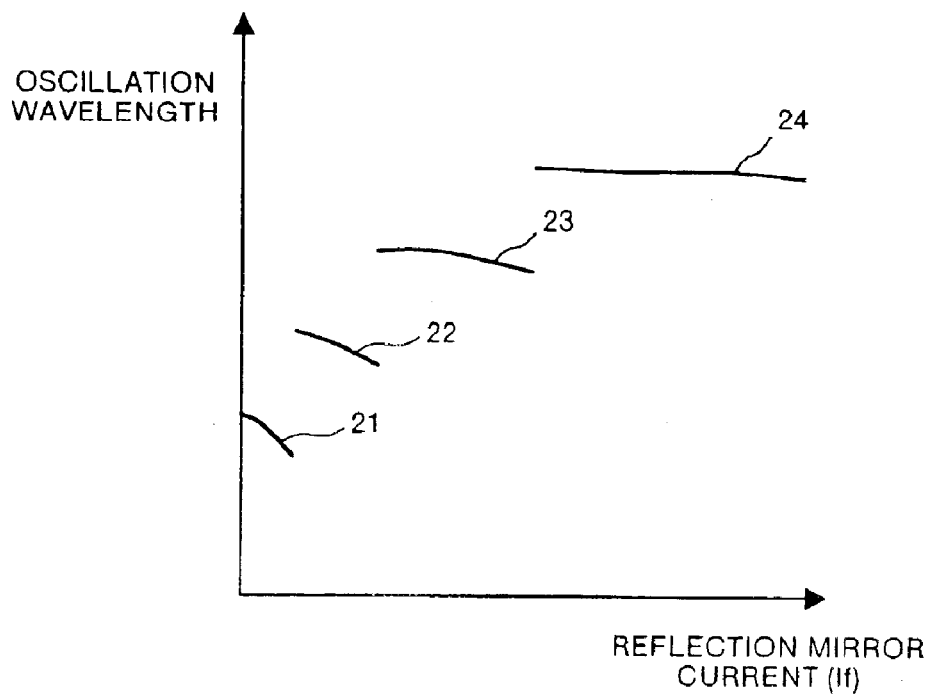
FIG. 6 shows the oscillation wavelength characteristics when Ir is fixed and If is changed.

FIG. 6 is a diagram which shows changes in the oscillation wavelength when the injection current Ir to the rear reflector is fixed to a constant value Ire and only the injection current If to the front reflector is changed. In FIG. 6, the oscillation wavelength when the oscillation point is in the area between the oscillation-mode boundaries Ka and Kb is expressed by a curve 21. The oscillation wavelength when the oscillation point is in the area between the oscillation-mode boundaries Kb and Kc is expressed by a curve 22. The oscillation wavelength when the oscillation point is in the area between the oscillation-mode boundaries Kc and Kd is expressed by a curve 23. The oscillation wavelength when the oscillation point is in the area between the oscillation-mode boundaries Kd and Ke is expressed by a curve 24.

As clear from FIG. 6, the oscillation wavelength changes continuously (changes in the unit of about 0.1 to 0.2 nm) in the area encircled between two oscillation-mode boundaries. However, when the area shifts to an adjacent area beyond the area encircled by two oscillation-mode boundaries, the oscillation wavelength jumps by about 1 nm to 15 nm. This jump is attributable to a mode hopping that the wavelength jumps large. In other words, when only one of the reflection characteristics 41 and 42 of the front reflection mirror area 10 and the rear reflection mirror area 11 is changed, the SSG mode shifts to an adjacent reflection peak due to the vernier effect, and the wavelength jumps large.

On the other hand, when the oscillation point is shifted from the left lower position to the right upper position within the area encircled by the two oscillation-mode boundaries, the oscillation wavelength continuously changes to the short wavelength side as described above. This corresponds to a shift of the mode from the oscillation longitudinal-mode to the adjacent longitudinal-mode.

In FIG. 3, there are many small areas that are shown as small square outline blocks K. Many outline blocks K exist in the oscillation-mode boundaries Ka to Ke. These outline blocks K also exist to some extent in the longitudinal-mode boundaries shown by the broken lines in FIG. 4. These outline blocks K are areas in which the oscillation is unstable. Multi-mode oscillation or longitudinal-mode simultaneous oscillation occurs in these areas.

Figure 7A:
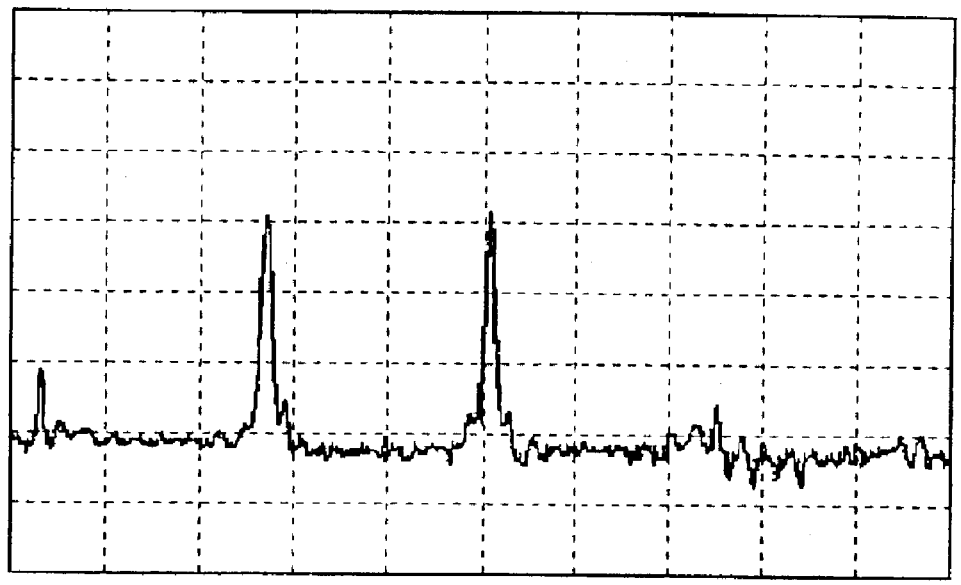
FIG. 7B shows wavelength spectra in a single longitudinal-mode oscillation in the SSG-DBR semiconductor laser and FIG. 7A shows the same in an unstable mode oscillation.
Figure 7B:
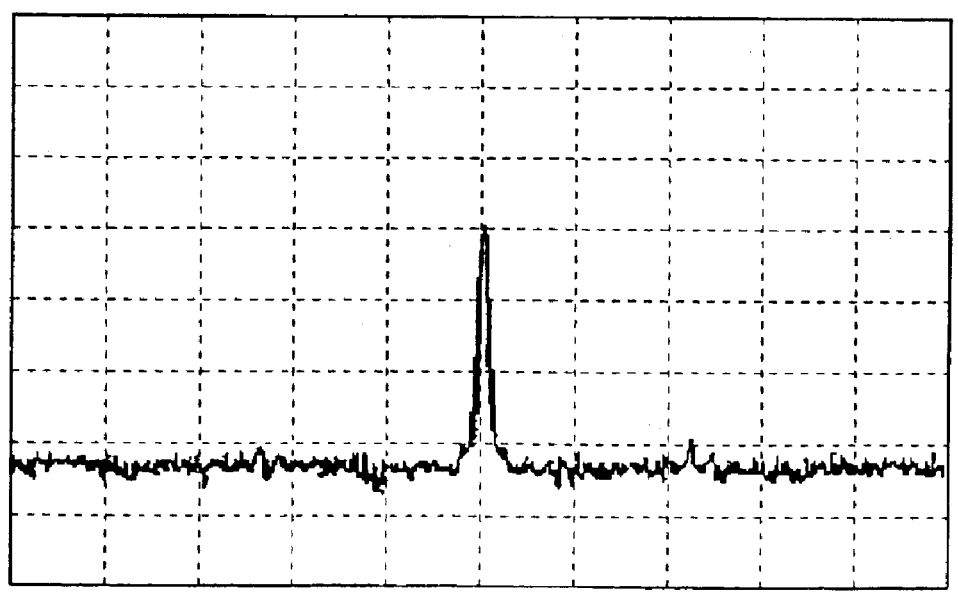

FIG. 7A shows an oscillation spectrum that has been measured in the area (at a point A in FIG. 3 and FIG. 4: If=13.8 mA, Ir=17 mA) where unstable oscillation occurs. FIG. 7B shows an oscillation spectrum that has been measured in the area (at a point B in FIG. 3 and FIG. 4: If=18 mA, Ir=17 mA) where stable oscillation occurs. The point B has been selected as a point near the center of one scale-shaped area encircled by the solid lines and broken lines in FIG. 4.

As shown in FIG. 7A, the oscillation occurs in two different wavelengths at the point A as a multi-mode oscillation. The oscillation does not always occur in the two wavelengths at the same time, but the oscillation irregularly occurs in one of the two wavelengths on the time axis. This is attributable to the contention between the adjacent SSG modes, and the oscillation becomes unstable for this reason. On the other hand, at the point B that has been selected as a point near the center of the scale-shaped area, a single longitudinal-mode oscillation is obtained as shown in FIG. 7B.

As explained above, according to the wavelength variable semiconductor laser of the DBR system, a center portion of each same-wavelength oscillation area (scale-shaped area) 20 encircled by the solid lines and the broken lines becomes an area where the oscillation occurs stably in the single longitudinal-mode. The oscillation becomes unstable in the boundary areas (areas near the solid lines and the broken lines in FIG. 4).

The wavelength reader 6 will be explained next. The wavelength reader 6 is an apparatus that discriminates between the wavelengths of the input lights, and outputs a wavelength monitoring signal that changes according to the wavelength. The wavelength reader 6 comprises a wavelength filter and a light detector. The wavelength filter has a characteristic of changing the transmittance according to the input light wavelength. For the wavelength filter, a Fabry-Perot etalon, a double refraction filter, a thin-film filter, a fibergrating, etc. are used. The wavelength filter converts wavelength information into intensity information by utilizing the characteristic of changing the transmittance according to the input light wavelength of the wavelength filter.

The light detector converts the optical signal from the wavelength filter into an electric signal. Based on this, it is possible to obtain an electric signal of intensity corresponding to the wavelength.

The oscillation-mode discriminator 7 will be explained next. The oscillation-mode discriminator 7 decides whether a single-mode oscillation is being carried out or a multi-mode oscillation is being carried out, according to the oscillation-mode state. The oscillation-mode discriminator 7 outputs an oscillation-mode monitoring signal that shows a result of the decision made. The oscillation-mode discriminator 7 detects a multi-mode oscillation that is attributable to the contention between the adjacent SSG modes. Frequently, this multi-mode oscillation occurs near the oscillation-mode boundaries Ka to Ke as described above.

The longitudinal-mode discriminator 8 will be explained next. The longitudinal-mode discriminator 8 decides whether simultaneous oscillation occurs between the adjacent longitudinal-modes (refer to the resonance longitudinal-mode 43 in FIG. 2) or not. The longitudinal-mode discriminator 8 outputs a longitudinal-mode monitoring signal that shows a result of this decision made. In other words, this longitudinal-mode discriminator 8 detects the simultaneous oscillation between the adjacent longitudinal-modes that occurs when If and Ir are changed continuously from the left lower position to the right upper position in FIG. 3 or FIG. 4. Frequently, the simultaneous oscillation of the longitudinal-mode occurs at the longitudinal-mode boundaries shown by the broken lines in FIG. 4.

The resolution of the decision and the operation range necessary for the decision are different between the oscillation-mode discriminator 7 and the longitudinal-mode discriminator 8. However, detectors of the same structure can be used in principle. For example, the longitudinal-mode discriminator 8 needs to resolve the difference of 0.1 nm, but does not need to detect a difference of 2 nm or above. On the other hand, the oscillation-mode discriminator 7 may decide a difference of approximately 2 nm or above, but needs the operation range of 30 nm or above.

The oscillation-mode discriminator 7 and the longitudinal-mode discriminator 8 can have the following structures (a) to (d):

(a) The oscillation-mode discriminator 7 and the longitudinal-mode discriminator 8 are constructed from a spectroscope and an array-type light receiving device that receives the light obtained by the spectroscope. The spectroscope disperses the incident monitoring light into different directions for each wavelength. The array-type light receiving device has light receiving devices laid out in an array shape. The position of each light receiving device corresponds to a wavelength. The array-type light receiving device can measure an optical spectrum by detecting the light intensity of each light receiving device and by plotting. Based on the optical spectrum information, it is possible to detect presence or absence of a multi-mode oscillation due to the contention of the SSG mode and presence or absence of simultaneous oscillation between the adjacent modes.

(b) The oscillation-mode discriminator 7 and the longitudinal-mode discriminator 8 are constructed from a spectroscope and a light position detecting device (for example, a position-sensitive detector: PSD) that detects a light receiving position of a spot light obtained by the spectroscope. This light position detecting device obtains a center-of-mass position of a spectrum as a detection output. The light position detecting device stores in advance the center-of-mass position in the normal single-mode oscillation or stores in advance the log data of the wavelength correction control. By detecting presence or absence of a deviation between the stored data and the detection output of the light position detecting device, it is possible to detect presence or absence of a multi-mode oscillation due to the contention of the SSG mode and presence or absence of simultaneous oscillation between the adjacent modes.

(c) A monitoring light is passed through two etalons that are disposed in parallel. Separate light receivers detect light that has passed through each etalon. The two etalons have different transmission center wavelengths or widths. An absolute wavelength of the monitoring light is detected based on the outputs of the two light receivers. The wavelength reader 6 also detects the wavelength of the monitoring light. Therefore, when the wavelength obtained by the wavelength reader 6 and the wavelength obtained based on the structure of the two etalons are equal, it is inferred that the single-mode oscillation is being carried out. When the two wavelengths are different from each other, it is inferred that the multi-mode oscillation is being carried out.

(d) A light detector that can detect only the AC components excluding the DC components of a monitoring light is used. When the oscillation-mode becomes unstable due to the mode contention or the like, relative intensity noise increases. Therefore, the output (AC components) from the light detector increases when the oscillation becomes the multi-mode oscillation, and the output from the light detector decreases when the oscillation becomes a single-mode oscillation. A threshold value is set to the output signal of the light detector. It is inferred that the oscillation is a multi-mode oscillation when the output signal is equal to or above the threshold value, and it is a single-mode oscillation when the output signal is less than the threshold value.

The light output measurer 9 outputs a signal corresponding to a change in the intensity of the monitoring light as a light intensity-monitoring signal. The light output measurer 9 may be constructed from a light detector (a photodiode). The characteristic of light detector is such that when the intensity of the input light increases, the output signal increases, and when the intensity of the input light decreases, the output signal decreases. Therefore, it is possible to detect a change in the intensity of the laser beam by monitoring this signal.

The operating section 5 applies an instruction to the control power source section 4 to control the injection current (Ia, If, Ir, Ip) to the semiconductor laser 1, and controls the temperature adjuster 14 to control the device temperature, based on a wavelength monitoring signal from the wavelength reader 6, an oscillation-mode monitoring signal from the oscillation-mode discriminator 7, a longitudinal-mode monitoring signal from the longitudinal-mode discriminator 8, a light intensity monitoring signal from the light output measurer 9, and a temperature monitoring signal from the temperature monitor (not shown). The operating section 5 incorporates a current table that has the injection current If to the front reflector and the injection current Ir to the rear reflector that have been prepared at the time of manufacturing, as variables. The operating section 5 obtains the injection currents If and Ir corresponding to target wavelengths by using this current table. The operating section 5 passes the obtained injection currents If and Ir to the semiconductor laser 1 via the control power source section 4 to make the semiconductor laser 1 carry out laser oscillation. The oscillation wavelength control apparatus 2 corrects variations in the oscillation wavelength due to a time lapse, by correcting the oscillation wavelength according to the wavelength correction mode to be described later. Therefore, the current table having a certain level of precision is acceptable.

In other words, the oscillation wavelength of the semiconductor laser 1 changes depending on chip manufacturing conditions, driving current, temperature, and time lapse. Therefore, after the semiconductor laser 1 has been manufactured or after the semiconductor laser 1 has been built into the optical communication apparatus, the wavelength correction mode for correcting the oscillation wavelength as explained later is implemented periodically or is implemented during a trial operation prior to the transmission of an optical signal from the optical communication apparatus. Based on this, the oscillation wavelength is converged to the target wavelength.

The control power source section 4 controls the injection currents (Ia, If, Ir, Ip) to the semiconductor laser 1, and controls the temperature adjuster 14 to control the device temperature, based on the instruction from the operating section 5.

The wavelength correction mode for correcting the oscillation wavelength will be explained with reference to a flowchart shown in FIG. 8 and diagrams shown in FIGS. 9 to 12. In this wavelength correction mode, the operating section 5 first takes out the stored values of the setting of the injection currents If and Ir corresponding to the target wavelength $\lambda c$. The operating section 5 starts the inverse-phase current sweep control by using a combination of these currents as an initial value of the sweep current (step S100). For example, for initial values If0 and Ir0 of the injection currents If and Ir corresponding to the target wavelength $\lambda c$, the data stored in the current table are used.

In the inverse-phase current sweep control, the injection current If to the front reflector and the injection current Ir to the rear reflector are injected in mutually inverse phases to the front reflection mirror area 10 and the rear reflection mirror area 11, respectively, as shown in FIG. 9 (step S110). FIG. 9 shows an inverse-phase current of a triangular wave as the injection currents If and Ir. Inverse phase AC component current is superimposed on the respective initial values If0 and Ir0 so that the amplitude gradually increases respectively.

According to the inverse-phase current control, one of the injection currents If and Ir to the front and rear reflectors is increased, and the other current is decreased. Therefore, as shown by an arrow mark J in FIG. 10, the oscillation control point moves in single oscillation around the initial value (If0, Ir0) to a point in the second quadrant (a left upper area from the initial value) and to a point in a fourth quadrant (a right lower area from the initial value) around the initial value (If0, Ir0) in the coordinate space having the injection currents If and Ir as coordinate axes. The directions of movement of the oscillation control point are different depending on the amplitude ratio of the AC component current that is given to the injection currents If and Ir to the front and rear reflectors.

However, so long as the inverse-phase current is being applied, the oscillation control point moves in single oscillation between the left upper area and the right lower area of the initial value around the initial value (If0, Ir0). Therefore, when the amplitude of the AC component that is superimposed on the initial value is gradually increased, the oscillation control point reaches two oscillation-mode boundaries (Kc and Kd) at some time. The wavelength reader 6 or the oscillation-mode discriminator 7 can detect this reach to the oscillation-mode boundaries or the skipping of the oscillation-mode boundaries, as described above. Therefore, according to the inverse-phase current control, it is possible to detect the oscillation-mode boundaries, even when the oscillation control point and the oscillation-mode boundary corresponding to the desired wavelength on the current table have varied due to the time lapse or the like.

Figure 11:
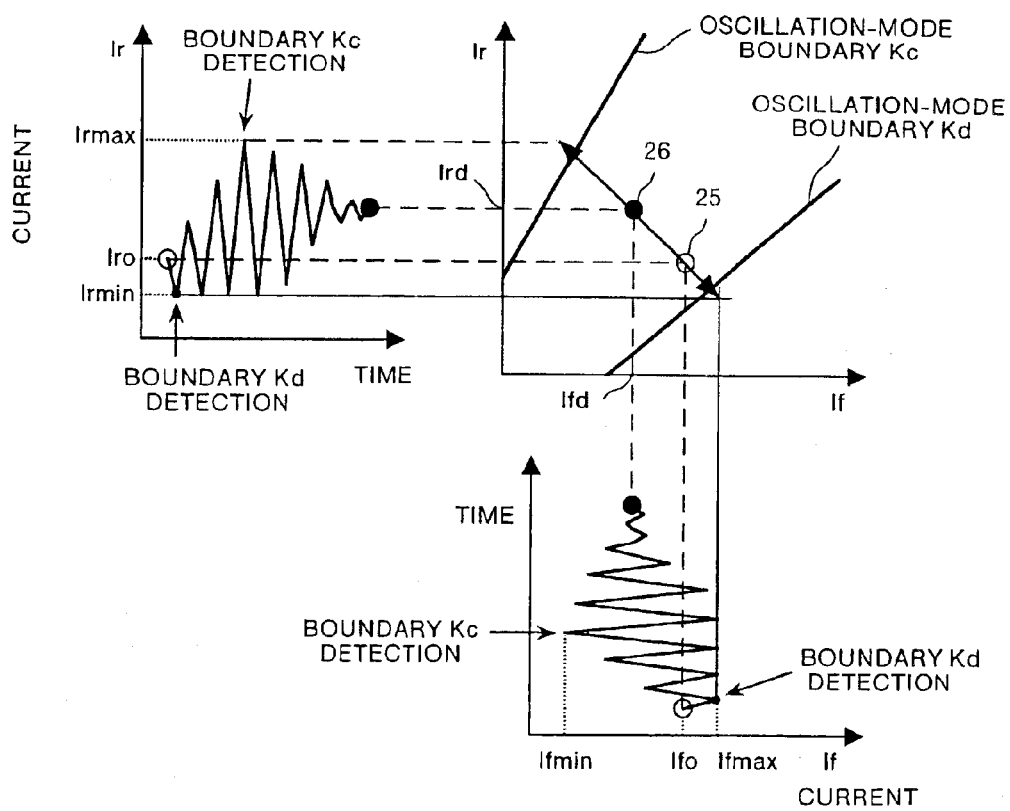
FIG. 11 explains the concept behind how the current sweep control is performed in the first embodiment.

FIG. 11 shows the inverse current sweep control. The inverse current sweep control is started from an initial oscillation point 25 (If0, Ir0) shown by a white circle. When the inverse current sweep control has been started, the operating section 5 decides whether one of the oscillation-mode boundaries has been exceeded or not, based on the signal from the wavelength reader 6 or the oscillation-mode discriminator 7 (step S120). The operating section 5 continues the sweep control according to the inverse-phase current that gradually increases the amplitude of the AC component current until the time when the operating section 5 decides that the oscillation control point has exceeded one of the oscillation-mode boundaries.

When the operating section 5 detects that the oscillation control point has exceeded one of the oscillation-mode boundaries, it decides which one of the oscillation-mode boundaries has been exceeded, and temporarily stores the current condition at the point of time when the boundary has been exceeded. When the signal of the wavelength reader 6 has shifted (mode-hopped) to a long wavelength side by a predetermined range (for example, 1 nm to 15 nm), the operating section 5 decides that the oscillation-mode boundary (Kd in this case) on the long wavelength side has been exceeded. When the signal of the wavelength reader 6 has shifted to a short wavelength side by a predetermined range, the operating section 5 decides that the oscillation-mode boundary (Kc in this case) on the short wavelength side has been exceeded. In the example shown in FIG. 11, the oscillation-mode boundary Kd has been detected first. In FIG. 11, the current condition when a decision has been made that the oscillation-mode boundary Kd has been exceeded is If=Ifmax, and Ir=Irmin. In other words, the current condition when one of the oscillation-mode boundaries Kd has been detected is that one injection current takes a maximum value and the other injection current takes a minimum value.

The operating section 5 gradually shifts the current of the DC component while gradually increasing the amplitude of the AC component current so that the other extreme value gradually increases in the state that one extreme value of the amplitude of the AC component current is fixed to the current condition (If=Ifmax, and Ir=Irmin) when the decision has been made that the oscillation-mode boundary Kd has been exceeded (step S130). Therefore, in FIG. 11, after the Kd has been detected oscillation-mode boundary, a maximum value of the amplitude of the AC component current is fixed to If=Ifmax for the injection current If to the front reflector, and a minimum value of the amplitude of the AC component current is fixed to Ir=Irmin for the injection current Ir to the rear reflector. When the amplitude has increased after one of the oscillation-mode boundaries Kd has been detected, a current change twice that of the DC component is given to the increase in the other extreme value of the AC component current.

During the increase of the amplitude, the operating section 5 decides whether the other oscillation-mode boundary has been exceeded or not, based on the signal of the wavelength reader 6 or the oscillation-mode discriminator 7 (step S140). The operating section 5 continues to control the amplitude increase, until the time when the operating section 5 decides that the oscillation control point has exceeded the other oscillation-mode boundary.

When the operating section 5 has detected that the oscillation control point has exceeded the other oscillation-mode boundary, the operating section 5 temporarily stores the current condition at the point of time when the other oscillation-mode boundary has been exceeded. In FIG. 11, the current condition when a decision has been made that the other oscillation-mode boundary Kc has been exceeded is If=Ifmin, and Ir=Irmax. In other words, the current condition when the other oscillation-mode boundary Kc has been detected is that one injection current takes a minimum value and the other injection current takes a maximum value.

Thereafter, the operating section 5 gradually decreases the amplitude of the AC component current and shifts the current of the DC component so that the injection currents If and Ir converge to the center values If=(Ifmin+If max)/2 and Ir=(Irmin+Irmax)/2 of the two current conditions If=(Ifmin, Ifmax) and Ir=(Irmin, Irmax) when the oscillation-mode boundaries Kc and Kd have been detected (step S150). Even when gradually decreasing the amplitude, the operating section 5 converges the oscillation control point to a point near the center value of the two current conditions while confirming that the oscillation wavelength is within a predetermined permissible range from the target wavelength λc, based on the signals from the wavelength reader 6 and the oscillation-mode discriminator 7 (step S160). In the example shown in FIG. 11, the oscillation control point is converged to an oscillation control point 26 (If=Ifd, Ir=Ird) shown by a black circle.

When the oscillation control point has been converged, the operating section 5 decides whether the oscillation wavelength is within a predetermined permissible range from the target wavelength λc or not and whether the single-mode oscillation has been carried out or not at the converged oscillation control point, based on the signals from the wavelength reader 6 and the oscillation-mode discriminator 7 (step S170).

When it has been decided that the oscillation wavelength is within a predetermined permissible range from the target wavelength λc and that the single-mode oscillation has been stably carried out, the wavelength correction mode for correcting the oscillation wavelength ends.

When the decision made at step S170 is NO, the operating section 5 executes fine adjustment according to the in-phase current control (step S180). According to this in-phase current control, the injection currents If and Ir to the front and rear reflectors are simultaneously increased or decreased. Therefore, as shown by an arrow mark P in FIG. 12, the oscillation control point moves in single oscillation around the converged current value (Ifd, Ird) to a point in the first quadrant (a right upper area from the converged value) and to a point in the third quadrant (a left lower area from the converged current value) around the converged current value (Ifd, Ird) in the coordinate space having the injection currents If and Ir as coordinate axes. The directions of movement of the oscillation control point are different depending on the amplitude ratio of the AC component current that is given to the injection currents If and Ir to the front and rear reflectors. However, so long as the in-phase current is being applied, the oscillation control point moves between the left lower area and the right upper area of the converged current value around the converged current value (Ifd, Ird).

In this in-phase current control, the operating section 5 determines the increase or decrease of the injection currents If and Ir to the front and rear reflectors and the direction according to the error signal that shows the error between the wavelength detection signal from the wavelength reader 6 and the target wavelength λc. When the error signal is large, the operating section 5 makes large the increase or decrease of the injection currents If and Ir to the front and rear reflectors. When the error signal is small, the operating section 5 makes small the increase or decrease of the injection currents If and Ir to the front and rear reflectors. When the oscillation control point has been shifted to the long wavelength side, the operating section 5 decreases the injection currents If and Ir to the front and rear reflectors.

When the oscillation control point has been shifted to the short wavelength side, the operating section 5 increases the injection currents If and Ir to the front and rear reflectors. During the in-phase current control, the operating section 5 feedback controls the injection currents to the oscillation control point at which the error signal value becomes smaller than the permissible range of values and a hopping signal is not generated from the longitudinal-mode discriminator 8, based on the signals from the wavelength reader 6 and the longitudinal-mode discriminator 8.

Figure 12:
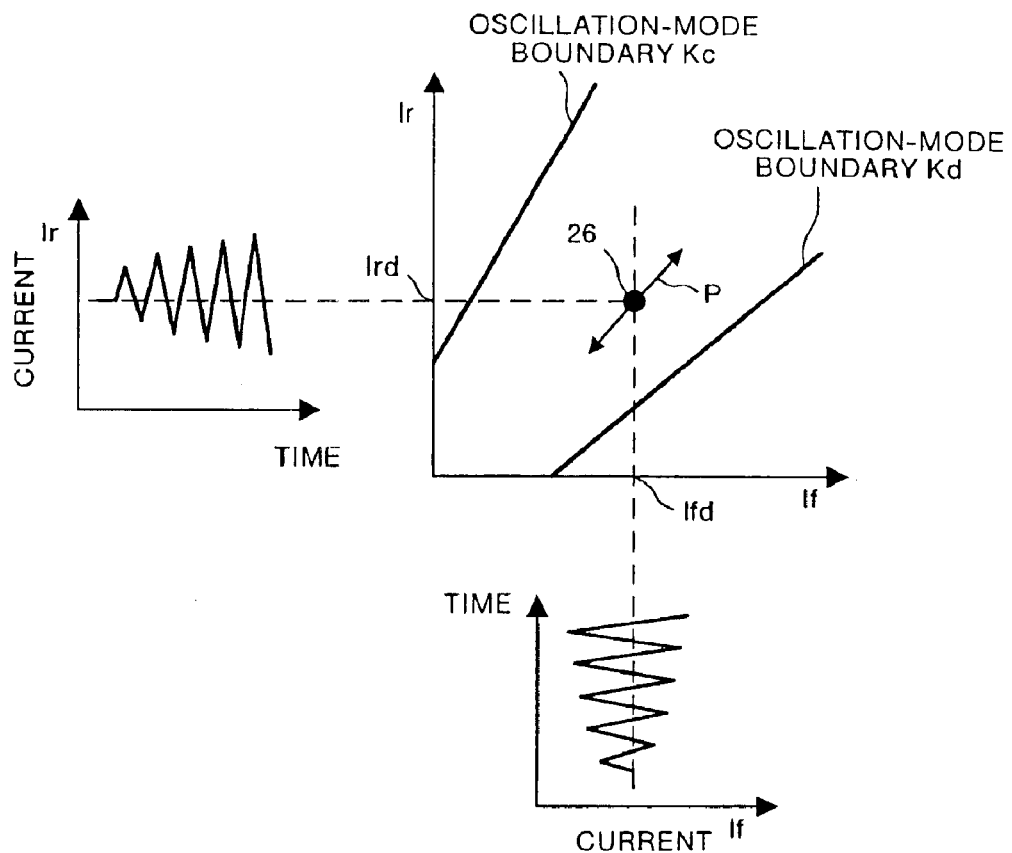
FIG. 12 explains how an in-phase current sweep control is performed and shows sweep directions of an oscillation control point in this control.

FIG. 12 shows an example of an in-phase waveform that is different from a waveform in the actual in-phase current control (only the amplitude gradually increases). In the example shown in FIG. 12, single oscillation occurs between the left lower area and the right upper area so that the amplitude gradually increases around the converged current value (Ifd, Ird).

As explained above, according to the first embodiment, the inverse-phase current sweep control is first carried out to the front reflection mirror area 10 and the rear reflection mirror area 11. Based on this, the oscillation control point is converged to the vicinity of the center of the two oscillation-mode boundaries at which stable single-mode oscillation is obtained. When it is not possible to obtain stable single-mode oscillation in the desired target wavelength at this converged point, the in-phase current sweep control is carried out to fine adjust the oscillation control point. Based on this, the oscillation control point is converged to an oscillation control point at which the oscillation wavelength is within a predetermined permissible range from the target wavelength and stable single-mode oscillation is obtained. Therefore, even when the oscillation wavelength of the semiconductor laser 1 has changed due to variations in the chip manufacturing conditions, changes in the driving current, changes in temperature, and time lapse, it is possible to automatically shift the oscillation control point to a stable oscillation point corresponding to the target wavelength, by implementing the wavelength correction mode periodically or during a trial operation prior to the transmission of an optical signal.

According to the first embodiment, sweep control is carried out to simultaneously change, not separately change, the injection currents to the two reflection mirrors 10 and 11. Therefore, the control procedure becomes simple. Further, when the wavelength correction mode is implemented after the shipment as well, it is possible to automatically converge the oscillation control point to a stable oscillation point. Consequently, it is not necessary to prepare a strictly high-precision current table at the time of the shipment, and it is sufficient to prepare a current table having a certain level of precision. In the extreme case, it is not necessary to prepare a current table, and a constant initial value may be provided.

According to the in-phase current sweep control, it is possible to detect the oscillation-mode boundaries. Therefore, it is possible to converge the oscillation control point to the optimum oscillation control point within the same-wavelength oscillation area 20 that is encircled by the oscillation-mode boundaries. By carrying out the sweep beyond the oscillation-mode boundaries, it is also possible to control the wavelength when the oscillation control point corresponding to the target wavelength is included in the adjacent same-wavelength oscillation area 20' (refer to FIG. 5).

In the first embodiment, while the inverse-phase current sweep control is carried out first, and then the in-phase current sweep control is carried out, it is also possible to first carry out the in-phase current sweep control and then carry out the inverse-phase current sweep control. Alternatively, it is possible to carry out the inverse-phase current sweep control or the in-phase current sweep control as a single control, and converge the oscillation control point to the optimum oscillation control point.

It is also possible to converge the oscillation control point to the optimum oscillation control point by moving the oscillation control point in an optional direction or along a predetermined track by suitably combining the in-phase current sweep control and the inverse-phase current sweep control, while making a feedback of the output of the oscillation state deciding section 3. In this case, a correlation is decided between the change level of the injection currents to the two reflection mirrors 10 and 11 and the change level of the wavelength obtained from the oscillation state deciding section 3. The current level to be changed next and the increase and decrease of the current level are obtained based on this decision.

The current sweep control based on the injection currents If and Ir to the two reflection mirrors 10 and 11 has been described above. However, it is also possible to converge the oscillation control point to the optimum oscillation control point by using any one or a combination of the control based on the injection current Ia to the active layer area 12, the injection current Ip to the phase control area 13, and the temperature control of the temperature adjuster 14, in addition to the injection currents If and Ir.

The current sweep control that uses the detection signals of the wavelength reader 6, the oscillation-mode discriminator 7, and the longitudinal-mode discriminator 8 has been explained above. The operating section 5 can also carry out the current sweep control by using the output of the light output measurer 9 in addition to these units. In other words, the control temperature is slightly changed according to the total current injection in order to control the light output to a constant level. The absorption loss increases when the injection currents to the reflection mirrors 10 and 11 have been increased as a result of the wavelength control. Therefore, it is necessary to increase the injection current to the active layer area 12. This operation brings about reduction in the internal quantum efficiency and drift of the oscillation wavelength. When this positive feedback is continued, the stable state collapses, and an oscillation state that includes much noise and that is not suitable for the optical transmission network occurs. In order to avoid this problem, device temperature is controlled according to the quantity of the control current. Based on this control, it is possible to obtain a light output that is suitable for the optical communication network that is stable over the total oscillation wavelength.

In order to control the device temperature, it is possible to use the temperature adjuster 14 for each of the front reflection mirror area 10, the rear reflection mirror area 11, the active layer area 12, and the phase control area 13. Based on this structure, it is possible to carry out the independent temperature control of each area. Therefore, it is not necessary to take into account the effect of mutual temperature drift. Further, as the load decreases, it is possible to obtain the effect of stable and high-speed control.

A second embodiment of the present invention will be explained with reference to FIG. 13. According to the second embodiment, the amplitude ratio (Sf/Sr) of the AC component current of the front reflector injection current If and the rear reflector injection current Ir is coincided (Sf/Sr=Ir0/If0) with the inverse (Ir0/If0) of the ratio of the DC component current ratio (If0/Ir0) of the front reflector injection current If and the rear reflector injection current Ir, in the inverse-phase current sweep control and the in-phase current sweep control that has been explained in the first embodiment.

Figure 13:
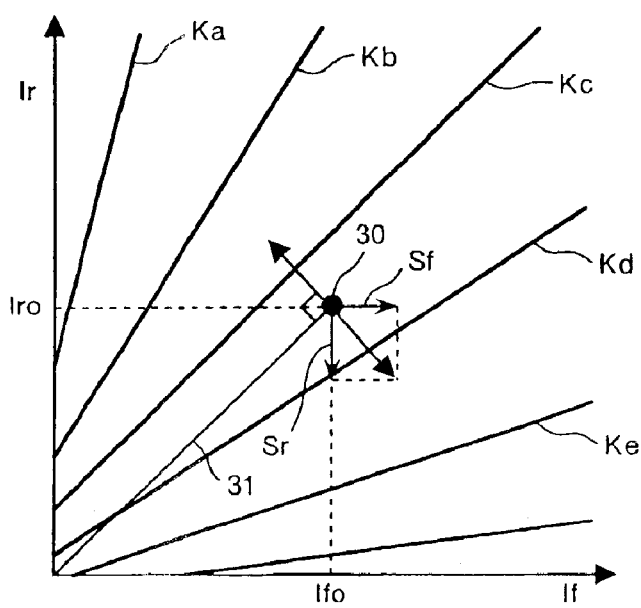
FIG. 13 explains how the current sweep control of the wavelength variable semiconductor laser is performed in a second embodiment of the present invention.

FIG. 13 is a diagram which shows an inverse-phase current sweep control in the coordinate space that has injection currents If and Ir as coordinate axes. In FIG. 13, an oscillation control point 30 is the initial value of the inverse-phase current sweep control, that is the initial value (If=If0, Ir=Ir0) of the DC component current. The amplitude ratio (Sf/Sr) of the AC component current that is superimposed on the DC component current is coincided (Sf/Sr=Ir0/If0) with the inverse of the ratio of the DC component current (Ir0/If0). Then, the oscillation control point is shifted to a direction perpendicular to a straight line 31 that connects the oscillation control point 30 and the origin. Frequently, the inclination of each of the oscillation-mode boundaries Ka to Ke (particularly, each inclination of the oscillation-mode boundaries Kc and Kd at the center) is close to a value of the inclination of the straight line 31. Based on the setting of this amplitude ratio, the oscillation control point is made close to the oscillation-mode boundaries Ka to Ke from an angular direction near the right angle relative to the oscillation-mode boundaries Ka to Ke. Therefore, it is possible to detect the oscillation-mode boundaries Ka to Ke efficiently and at high speed. As a result, the convergence time to the optimum oscillation control point is shortened.

On the other hand, in the in-phase current sweep control, the amplitude ratio (Sf/Sr) of the AC component current is coincided (Sf/Sr=If0/Ir0) with the inverse of the ratio of the DC component current (If0/Ir0). Based on the setting of this amplitude ratio, the oscillation control point is shifted to a direction parallel with the oscillation-mode boundaries Ka to Ke. Therefore, it is possible to converge the oscillation control point to the optimum oscillation control point without taking the oscillation control point close to the oscillation-mode boundaries of unstable oscillation.

A third embodiment of the present invention will be explained with reference to FIG. 14. In the third embodiment, a semiconductor diffraction grating is used for light reflectors 10 and 11 like the wavelength variable semiconductor laser of the DBR system. An injection current If to a front reflector and an injection current Ir to a rear reflector are adjusted in a square root space of the currents If and Ir, based on the plasma effect of the diffraction grating (a phenomenon that the diffraction rate changes corresponding to changes in the carrier concentration according to the injection current).

Figure 14:
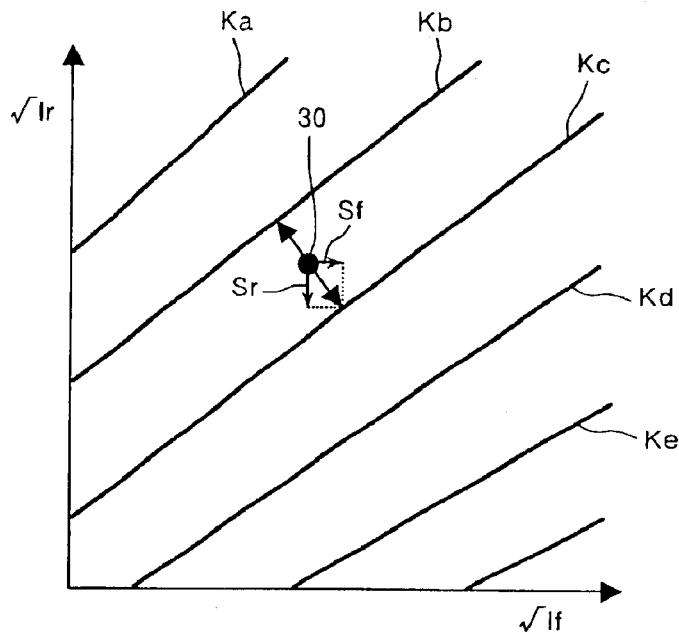
FIG. 14 explains how the current sweep control of the wavelength variable semiconductor laser is performed in a third embodiment of the present invention.

As shown in FIG. 14, when the distribution of oscillation wavelength is formed by using a square root $\sqrt{(If)}$ of the injection current to the front reflector and a square root $\sqrt{(Ir)}$ of the injection current to the rear reflector as coordinate axes, the inclinations of the oscillation-mode boundaries Ka to Ke become substantially the same and become parallel. Therefore, it is possible to make uniform the size of each same-wavelength oscillation area. At the same time, it is possible to make uniform the change of the wavelength within each same-wavelength oscillation area.

The length of the front reflection mirror area 10 in the light axis direction will be expressed as Lf, and the length of the rear reflection mirror area 11 in the light axis direction will be expressed as Lr. Then, the inclination of the oscillation-mode boundaries Ka to Ke is given as (1/Lr)/(1/Lf)=Lf/Lr in the square root space.

Therefore, in the inverse-phase current sweep control, the amplitude ratio (Sr/Sf) of the AC component current of an injection current Ir to a rear reflector and an injection current If to a front reflector are set to an inverse of the inclination (Lf/Lr) of the oscillation-mode boundaries Ka to Ke, that is, (Lr/Lf). In other words, the amplitude ratio of the injection currents to the reflectors is coincided with the ratio of the lengths of the reflectors. Based on the setting of this amplitude ratio, the oscillation control point is made close to the oscillation-mode boundaries Ka to Ke from an angular direction near the right angle relative to the oscillation-mode boundaries Ka to Ke. Therefore, it is possible to detect the oscillation-mode boundaries Ka to Ke efficiently and at high speed.

On the other hand, in the in-phase current sweep control, the amplitude ratio (Sr/Sf) of the AC component current are set to the inclination (Lf/Lr) of the oscillation-mode boundaries Ka to Ke, that is, (Lf/Lr). In other words, the amplitude ratio of the injection currents to the reflectors is coincided with the inverses of the ratio of the lengths of the reflectors. Based on the setting of this amplitude ratio, the oscillation control point is shifted to a direction parallel with the oscillation-mode boundaries Ka to Ke. Therefore, it is possible to converge the oscillation control point to the optimum oscillation control point without taking the oscillation control point close to the oscillation-mode boundaries of unstable oscillation.

A fourth embodiment will be explained next. In the fourth embodiment, the current sweep control explained in the first to third embodiments will not be carried out in analog. In the fourth embodiment, the current sweep control is digitally executed on the discrete lattice points of which current resolution is about the same as or rougher (an integer times the current resolution) than the current resolution that has been set to a control power source section 4. According to the current sweep control on the discrete lattice points, the calculation precision of an operating section 5 may be dropped. It is also possible to shorten the calculation time, and it is possible to increase the speed of wavelength control.

Figure 15:
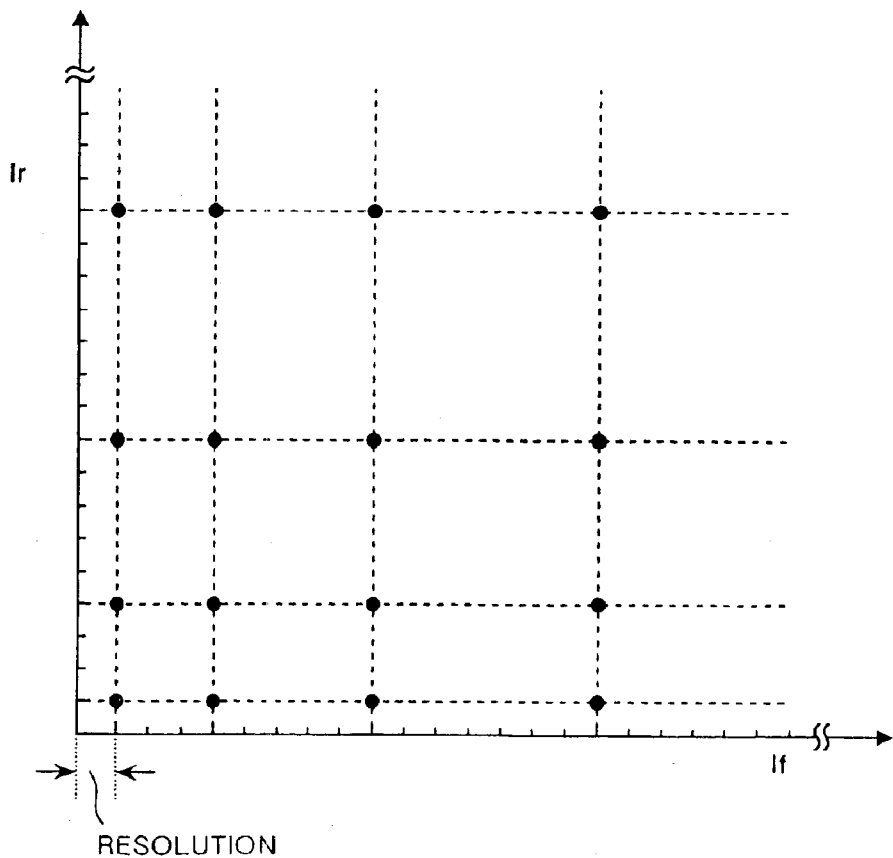
FIG. 15 explains the concept of the squared space of a setting current resolution.

In the current sweep control on the discrete lattice points, it is possible to easily carry out the current control substantially linearly, by setting the lattice points corresponding to the squared space of the current resolution that has been set to the control power source section 4 as shown in FIG. 15, or by plotting the lattice points to values obtained by adding a constant value to a square of the current resolution.

The change in the wavelength due to the plasma effect is in proportion to the squared root of the current applied. Therefore, by setting the lattice points to the squared space of the current resolution that has been set to the control power source section 4, it becomes possible to make uniform the intervals between the wavelength changes (wavelength change per one step) corresponding to the shift from a lattice point to an adjacent lattice point. As a result, it is possible to carry out the current control substantially linearly.

It is also possible to arrange as follows. In the current control of the first embodiment, when the error between the current wavelength detected by the wavelength reader 6 and the target wavelength is small, the oscillation control point is shifted to a plurality of discrete points in the vicinity of the target wavelength based on the discrete control of the current value, in addition to the feedback control according to the error component. The oscillation states at the plurality of shifted discrete points are obtained from an oscillation state deciding section 3. An optimum oscillation control point is selected from these oscillation states. According to this control, it is possible to search for an optimum oscillation control point easily and at high speed, without carrying out the sweep control of all the oscillation control points.

A fifth embodiment will be explained with reference to FIG. 16. The fifth embodiment relates to a control of switching a target wavelength to a separate value.

In the switching control of a set wavelength relating to the fifth embodiment, when a set wavelength is to be switched to a different wavelength beyond an oscillation-mode boundary, an operating section 5 carries out the following operation, and calculates an oscillation control point that corresponds to the wavelength of the switch destination.

Figure 16:
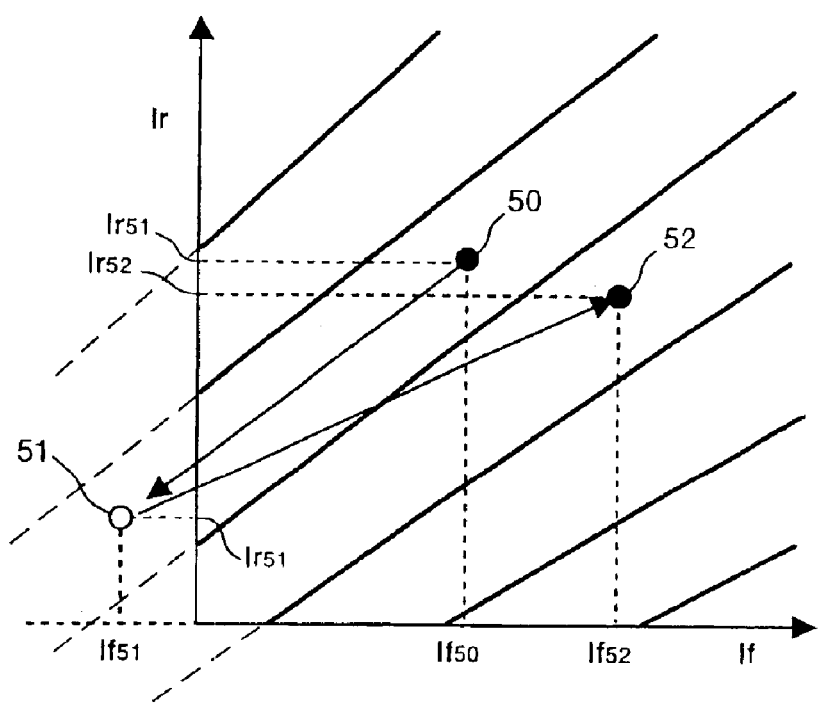
FIG. 16 explains how the current sweep control of the wavelength variable semiconductor laser is performed in a fifth embodiment of the present invention.

As shown in FIG. 16, an area within the same-oscillation-mode that is encircled by two oscillation-mode boundaries that includes an oscillation point 50 corresponding to the current point is extended. Based on this, a virtual point 51 (a point at which the current becomes a negative value, and it is not possible to actually carry out the control) corresponding to the target wavelength is once obtained. A candidate point 52 of an optimum oscillation control point beyond the oscillation-mode boundary is obtained via this virtual point 51.

The candidate point 52 of an optimum oscillation control point is obtained by using the following approximations:

$$\Delta \lambda c = \Delta \lambda u \times hop \; (\delta Iu/Id) + \Delta \lambda v \times \delta Iv \quad (1),$$

$$\delta If^2 + \delta Ir^2 = \delta Iv^2 + \delta Iu^2 \quad (2),$$

where hop ( ): a number that has exceeded an oscillation-mode boundary, and this value is rounded to an integer; $\Delta \lambda u$: a (known) change in the wavelength when an oscillation-mode boundary has exceeded; $\alpha \lambda v$: a (known) change in the wavelength corresponding to a unit current within the same-oscillation-mode; $\delta Iu$: a change in the current in a direction orthogonal to an oscillation-mode boundary; $\delta Iv$: a change in the current in a direction along an oscillation-mode boundary; Id: a width between oscillation-mode boundaries (converted in a current); $\delta If$: a change in the current of a front reflection mirror 10; $\delta Ir$: a change in the current of a rear reflection mirror 11, and $\Delta \lambda c$: a change in the oscillation wavelength.

The wavelength change $\Delta \lambda u$ when the oscillation-mode boundary has exceeded is a wavelength change when the oscillation control point has shifted to an adjacent oscillation-mode area beyond an oscillation-mode boundary. This value has been set to a predetermined value like 1 nm to 15 nm, for example. The wavelength change $\Delta \lambda v$ corresponding to a unit current within the same-oscillation-mode has also been set to a predetermined value. Currents at the points 50, 51 and 52 are (If50, Ir50), (If51, Ir51), and (If52, Ir52) respectively.

In the shift from the current oscillation point 50 to the virtual point 51, the shift is not beyond an oscillation-mode boundary. Therefore, $\delta Iu=0$, and the first term of the right hand side of the equation (1) and the second term of the equation (2) become 0.

As a result, the following relationship is established:

$$\Delta \lambda c = \Delta \lambda v \times \delta Iv = \Delta \lambda v \times \sqrt{\{(\delta If^2 + \delta Ir^2)\}} \quad (3)$$
$$= \Delta \lambda v \times \sqrt{\{(If41 - If40)^2 + (Ir41 - Ir40)^2\}},$$

where $\sqrt{\{ \; \}}$ indicates square root.

In the shift from the virtual point 51 to the candidate point 52, the wavelength does not change ($\Delta \lambda c=0$). Therefore, the equation (1) and (2) can be written as equation (4) and (5) as follows:

$$\Delta \lambda u \times hop \; (\delta Iu/Id) + \Delta \lambda v \times \delta Iv = 0 \quad (4),$$

$$(If52-If51)^2 + (Ir52-Ir51)^2 = \delta Iv^2 + \delta Iu^2 \quad (5).$$

When there is a candidate point in the adjacent mode, hop $(\delta Iu/Id)=1$ (or $-1$). Further, it is generally possible to set $\delta Iu=Id$.

The candidate point 52, that is, If52 and Ir52, is searched for to satisfy the equations (3) to (5).

According to the switching control of a set wavelength relating to the fifth embodiment, it is possible to control the wavelength without preparing a current table of all pre-scribed wavelengths, at the time of making large wavelength changes to the extent that it is not possible to stabilize the wavelength with the injection currents based on the output of the oscillation state deciding section 3 as explained in the first to fourth embodiments. In the above control, when a plurality of candidate points 52 exist, each candidate point is set to an initial value, and the current sweep control as explained in the first embodiment is carried out. With this arrangement, the wavelength is optimized to a prescribed wavelength of the optical communication network in the vicinity of each candidate point. Then, the operating section 5 selects a control point of the best oscillation state based on the signal from the oscillation state deciding section 3 at each optimum point and the signal from the control power source section 4. When there exist a plurality of candidate points in stable oscillation states, an optimum candidate point is selected by taking into account power consumption (power consumption is small when the injection current is small) and an error from the target wavelength.

It is possible to apply each wavelength control explained in the first to fifth embodiments to a wavelength variable semiconductor laser as a light source of the EA module that is mounted with the field-absorption type optical modulator (an EA converter, an electro-absorption modulator), a Raman amplifier, an erbium-added fiber amplifier, etc.

As explained above, according to one aspect of the present invention, the injection current to the first light reflector and the injection current to the second light reflector are swept simultaneously based on a result of a decision made by the oscillation state deciding section. Based on this, there are obtained current conditions of the injection current to the first light reflector and the injection current to the second light reflector that carry out single-mode oscillation in the target wavelength. The wavelength variable semiconductor laser is drive-controlled by using the obtained current conditions. Therefore, even when the oscillation wavelength has changed due to various factors including a time-lapse change, it is possible to converge an oscillation control point to a stable point corresponding to a target wavelength, without preparing a high-precision current table.

According to another aspect of the invention, the oscillation state of the wavelength variable semiconductor laser is decided based on the wavelength detected by the wavelength detector and the oscillation-mode detected by the oscillation-mode discriminator. Therefore, it is possible to detect the oscillation state including the wavelength and the oscillation-mode.

According to still another aspect of the invention, the oscillation-mode boundary of the wavelength variable semiconductor laser is searched for by simultaneously sweeping the injection current to the first light reflector and the injection current to the second light reflector. Based on a result of the search for the oscillation-mode boundary, there are obtained current conditions of the injection current to the first light reflector and the injection current to the second light reflector that carry out single-mode oscillation in the target wavelength. Therefore, it is possible to efficiently converge the oscillation control point to the same-oscillation-mode area that is encircled by two oscillation-mode boundaries. At the same time, it is possible to converge the oscillation control point to the adjacent oscillation-mode area beyond the oscillation-mode boundary.

According to still another aspect of the invention, in carrying out the sweep control, the injection current to the first light reflector and the injection current to the second light reflector are changed in the inverse phase. Therefore, it is possible to sweep the oscillation control point to a direction that crosses the oscillation-mode boundary. As a result, it is possible to rapidly converge the current condition to a direction to restrict the multi-mode oscillation.

According to still another aspect of the invention, in carrying out the inverse-phase sweep control, the amplitude of the injection current to the first light reflector and the injection current to the second light reflector is gradually increased. When one oscillation-mode boundary has been detected based on the output of the oscillation state deciding section during this gradual increase of the amplitude, the amplitude of each injection current is further increased gradually in the state that one extreme value of the amplitude of each injection current is fixed to a current condition of the detection time. When the other oscillation-mode boundary has been detected based on the output of the oscillation state deciding section during this gradual increase of the amplitude, the amplitude of each injection current is gradually decreased to converge to the center value of the amplitude of the detection time. Therefore, it is possible to efficiently converge the oscillation control point into the same-oscillation-mode area that is encircled by two oscillation-mode boundaries, without carrying out a wasteful sweeping to a current condition by exceeding the oscillation-mode boundary by a large quantum.

According to still another aspect of the invention, the sweep control is carried out to change in-phase the injection current to the first light reflector and the injection current to the second light reflector. Therefore, it is possible to sweep the oscillation control point to a direction substantially along the oscillation-mode boundary. When the oscillation control point has been slightly deviated from the target wavelength, it is possible to quickly converge the oscillation control point to the target wavelength.

According to still another aspect of the invention, at least one of the injection current to the active layer area, the injection current to the phase adjusting area, and the device temperature based on the temperature adjuster is adjusted, in addition to the injection current to the first light reflector and the injection current to the second light reflector. Therefore, it is possible to converge the oscillation control point to a prescribed wavelength in higher precision. Further, it is possible to suitably adjust the oscillation state.

According to still another aspect of the invention, the sweep control of the injection current is digitally executed in a discrete and lattice-point space. Therefore, excessive precision of the power source is not necessary, and it is possible to control the wavelength at high speed by selecting a control candidate point.

According to still another aspect of the invention, the lattice-point space is formed as a squared space of the current resolution of the power source. Therefore, it is possible to easily carry out the current control substantially linearly.

According to still another aspect of the invention, in changing the oscillation wavelength, the same-oscillation-mode area that is encircled by two oscillation-mode boundaries that includes the oscillation point corresponding to the current wavelength is extended, thereby to obtain a virtual point corresponding to the target wavelength. The oscillation control point corresponding to the changed wavelength beyond the oscillation-mode boundary is obtained by using predetermined equations based on the injection currents to the first and second light reflectors and the oscillation-mode boundaries for this virtual point and the oscillation point corresponding to the current wavelength. Therefore, it is possible to change the oscillation wavelength to an optional wavelength without preparing a current table for all prescribed wavelengths.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A wavelength control apparatus that controls an oscillation wavelength of a wavelength variable semiconductor laser, the wavelength variable semiconductor laser having first and second light reflectors into which respective currents may be injected to control light reflection and an active layer area disposed between the first and second light reflectors, each of the first and second light reflectors having a plurality of reflection peaks at respective wavelengths, the wavelength control apparatus comprising:

an oscillation state deciding section that decides an oscillation state of the wavelength variable semiconductor laser; and a drive controller that determines current conditions of an injection current injected into the first light reflector and an injection current injected into the second light reflector that produce single-mode oscillation at a target wavelength, by simultaneously sweeping the injection current injected into the first light reflector and the injection current injected into the second light reflector based on a decision made by the oscillation state deciding section, and controls driving of the wavelength variable semiconductor laser using the current conditions determined, wherein the drive controller searches for an oscillation-mode boundary of the wavelength variable semiconductor laser by simultaneously sweeping the injection current injected into the first light reflector and the injection current injected into the second light reflector based on the decision made by the oscillation state deciding section, and controls the sweeping of the injection current injected into the first light reflector and the injection current injected into the second light reflector for producing single-mode oscillation at the target wavelength based on the oscillation-mode boundary found by searching.

2. The wavelength control apparatus according to claim 1, wherein the oscillation state deciding section comprises:

a wavelength detector that detects wavelength of light emitted by the wavelength variable semiconductor laser; and an oscillation-mode discriminator that determines oscillation mode of the wavelength variable semiconductor laser.

3. The wavelength control apparatus according to claim 2, wherein the oscillation state deciding section further comprises:

a longitudinal-mode discriminator that determines presence or absence of simultaneous oscillation of adjacent longitudinal-modes; and in controlling the sweeping, the drive controller changes the injection current in-phase injected into the first light reflector and the injection current injected into the second light reflector based on at least outputs of the wavelength detector and the oscillation-mode discriminator.

4. The wavelength control apparatus according to claim 1, wherein the oscillation state deciding section further comprises:

a longitudinal-mode discriminator that determines presence or absence of simultaneous oscillation of adjacent longitudinal modes; and in controlling the sweeping, the drive controller changes the injection current in-phase injected into the first light reflector and the injection current injected into the second light reflector based on at least outputs of the wavelength detector and the oscillation-mode discriminator.

5. The wavelength control apparatus according to claim 1, wherein the wavelength variable semiconductor laser comprises:

a phase control area between the active layer area and the first light reflector or between the active layer area and the second light reflector; and a temperature adjuster that adjusts temperature of the wavelength variable semiconductor laser, wherein the drive controller adjusts at least one of the injection current injected into the active layer area, the injection current injected into the first light reflector, the injection current injected into the second light reflector, and the injection current injected into the phase control area, and the temperature of the laser in response to the temperature adjuster.

6. A wavelength control apparatus that controls an oscillation wavelength of a wavelength variable semiconductor laser, the wavelength variable semiconductor laser having first and second light reflectors into which respective currents may be injected to control light reflection and an active layer area disposed between the first and second light reflectors, each of the first and second light reflectors having a plurality of reflection peaks at respective wavelengths, the wavelength control apparatus comprising:

an oscillation state deciding section that decides an oscillation state of the wavelength variable semiconductor laser; and a drive controller that determines current conditions of an injection current injected into the first light reflector and an injection current injected into the second light reflector that produce single-mode oscillation at a target wavelength, by simultaneously sweeping the injection current injected into the first light reflector and the injection current injected into the second light reflector based on a decision made by the oscillation state deciding section, and controls driving of the wavelength variable semiconductor laser using the current conditions determined, wherein, in the sweeping, the drive controller changes the injection current injected into the first light reflector and the injection current injected into the second light reflector so that the currents injected have inverse phases.

7. The wavelength control apparatus according to claim 6, wherein, in the sweeping with inverse-phase currents, the drive controller gradually increases amplitude of the injection current injected into the first light reflector and the injection current injected into the second light reflector, and, when one oscillation-mode boundary has been detected by the oscillation state deciding section while gradually increasing the amplitude, the drive controller further increases gradually the amplitude of each injection current with one extreme value of the amplitude of each injection current fixed to a current condition upon detection of one oscillation-mode boundary, and, when another oscillation-mode boundary has been detected by the oscillation state deciding section while gradually increasing of the amplitude, the drive controller gradually decreases the amplitude of each injection current to converge to a center value of the amplitude of the detection, and controls the wavelength variable semiconductor laser using current conditions corresponding to the center value.

8. The wavelength control apparatus according to claim 6, wherein the oscillation state deciding section further comprises:

a longitudinal-mode discriminator that determines presence or absence of simultaneous oscillation of adjacent longitudinal modes; and in controlling the sweeping, the drive controller changes the injection current in-phase injected into the first light reflector and the injection current injected into the second light reflector based on at least outputs of the wavelength detector and the oscillation-mode discriminator.

9. The wavelength control apparatus according to claim 6, wherein the oscillation state deciding section comprises:

a wavelength detector that detects wavelength of light emitted by the wavelength variable semiconductor laser; and an oscillation-mode discriminator that determines oscillation mode of the wavelength variable semiconductor laser.

10. The wavelength control apparatus according to claim 9, wherein the oscillation state deciding section further comprises:

a longitudinal-mode discriminator that determines presence or absence of simultaneous oscillation of adjacent longitudinal-modes; and in controlling the sweeping, the drive controller changes the injection current in-phase injected into the first light reflector and the injection current injected into the second light reflector based on at least outputs of the wavelength detector and the oscillation-mode discriminator.

11. The wavelength control apparatus according to claim 6, wherein the wavelength variable semiconductor laser comprises:

a phase control area between the active layer area and the first light reflector or between the active layer area and the second light reflector; and a temperature adjuster that adjusts temperature of the wavelength variable semiconductor laser, wherein the drive controller adjusts at least one of the injection current injected into the active layer area, the injection current injected into the first light reflector, the injection current injected into the second light reflector, and the injection current injected into the phase control area, and the temperature of the laser in response to the temperature adjuster.

12. A method of controlling an oscillation wavelength of a wavelength variable semiconductor laser, the wavelength variable semiconductor laser having first and second light reflectors into which respective currents may be injected and an active layer area disposed between the first and second light reflectors, each of the first and second light reflectors having a plurality of reflection peaks as respective wavelengths, the wavelength control method comprising:

in changing the oscillation wavelength of the semiconductor laser, extending a same-oscillation-mode area that is encircled by two oscillation-mode boundaries that include an oscillation point corresponding to a wavelength of light currently produced to obtain a virtual point corresponding to a target wavelength; and obtaining the oscillation control point corresponding to a changed wavelength beyond the oscillation-mode boundary using equations based on injection currents injected into the first and second light reflectors, the oscillation-mode boundaries for this virtual point, and the oscillation point corresponding to the wavelength currently produced.

13. A wavelength control apparatus that controls an oscillation wavelength of a wavelength variable semiconductor laser, the wavelength variable semiconductor laser having first and second light reflectors into which respective currents may be injected to control light reflection and an active layer area disposed between the first and second light reflectors, each of the first and second light reflectors having a plurality of reflection peaks at respective wavelengths, the wavelength control apparatus comprising:

an oscillation state deciding section that decides an oscillation state of the wavelength variable semiconductor laser; and a drive controller that determines current conditions of an injection current injected into the first light reflector and an injection current injected into the second light reflector that produce single-mode oscillation at a target wavelength, by simultaneously sweeping the injection current injected into the first light reflector and the injection current injected into the second light reflector based on a decision made by the oscillation state deciding section, and controls driving of the wavelength variable semiconductor laser using the current conditions determined, wherein the drive controller digitally controls the sweeping of the injection currents injected into the first and second light reflectors in a discrete, lattice-point space.

14. The wavelength control apparatus according to claim 13, wherein the first and second light reflectors are diffraction gratings, and the drive controller forms the lattice-point space as a squared space of the current resolution of a power source.

15. The wavelength control apparatus according to claim 13, wherein the wavelength variable semiconductor laser comprises:

a phase control area between the active layer area and the first light reflector or between the active layer area and the second light reflector; and a temperature adjuster that adjusts temperature of the wavelength variable semiconductor laser, wherein the drive controller adjusts at least one of the injection current injected into the active layer area, the injection current injected into the first light reflector, the injection current injected into the second light reflector, and the injection current injected into the phase control area, and the temperature of the laser in response to the temperature adjuster.

16. The wavelength control apparatus according to claim 13, wherein the oscillation state deciding section comprises:

a wavelength detector that detects wavelength of light emitted by the wavelength variable semiconductor laser; and an oscillation-mode discriminator that determines oscillation mode of the wavelength variable semiconductor laser.

17. The wavelength control apparatus according to claim 16, wherein the oscillation state deciding section further comprises:

a longitudinal-mode discriminator that determines presence or absence of simultaneous oscillation of adjacent longitudinal-modes; and in controlling the sweeping, the drive controller changes the injection current in-phase injected into the first light reflector and the injection current injected into the second light reflector based on at least outputs of the wavelength detector and the oscillation-mode discriminator.

* * * * *